(12) United States Patent
Wrycraft

(10) Patent No.: US 6,796,817 B2
(45) Date of Patent: Sep. 28, 2004

(54) CIRCUIT BOARD EJECTOR MECHANISM INCLUDING FLEXIBLE COUPLING

(75) Inventor: Sean Conor Wrycraft, Harrow (GB)

(73) Assignee: Sun Microsystems, Inc., Santa Clara, CA (US)

(*) Notice: Subject to any disclaimer, the term of this patent is extended or adjusted under 35 U.S.C. 154(b) by 39 days.

(21) Appl. No.: 09/939,063

(22) Filed: Aug. 24, 2001

(65) Prior Publication Data
US 2002/0090851 A1 Jul. 11, 2002

(30) Foreign Application Priority Data
Jan. 9, 2001 (GB) .............................................. 0100517

(51) Int. Cl.⁷ .............................................. H01R 13/62
(52) U.S. Cl. ..................................... 439/160; 439/159
(58) Field of Search ................................. 439/160, 159, 439/923; 361/399

(56) References Cited

U.S. PATENT DOCUMENTS

| 4,740,164 A |   | 4/1988 | Schulz et al. |         |
|-------------|---|--------|---------------|---------|
| 5,414,594 A |   | 5/1995 | Hristake      |         |
| 5,629,836 A |   | 5/1997 | Wright        |         |
| 5,793,614 A | * | 8/1998 | Tollbom       | 361/732 |
| 6,036,511 A | * | 3/2000 | Hashimoto     | 439/159 |
| 6,185,106 B1 |  | 2/2001 | Mueller       |         |
| 6,381,146 B1 | * | 4/2002 | Sevier        | 361/754 |

FOREIGN PATENT DOCUMENTS

EP 0699019 A1 2/1996

OTHER PUBLICATIONS

UK Search Report, application No. GB01005172.2, filed Jan. 9, 2001.

* cited by examiner

Primary Examiner—Chandrika Prasad
(74) Attorney, Agent, or Firm—Meyertons Hood Kivlin Kowert & Goetzel, P.C.; B. Noel Kivlin

(57) ABSTRACT

An ejector mechanism (14) for a circuit board (2¹) and back plane (6¹), the ejector mechanism being operable to provide resiliently biased engagement between a first part (10) of an electrical connector (8) and a mutually engaging second part (12) of the electrical connector (8), the first and second parts of the electrical connector providing electrical connection for a plurality of electrical channels between the circuit board on which the first part is mounted and the back plane on which the second part is mounted. The ejector mechanism comprises an engaging projection (42) and a lever arm (40) pivotally mounted on one of the circuit board and the back plane and configured to engage the engaging projection (42) forming part of the other of the circuit board and the back plane.

11 Claims, 3 Drawing Sheets

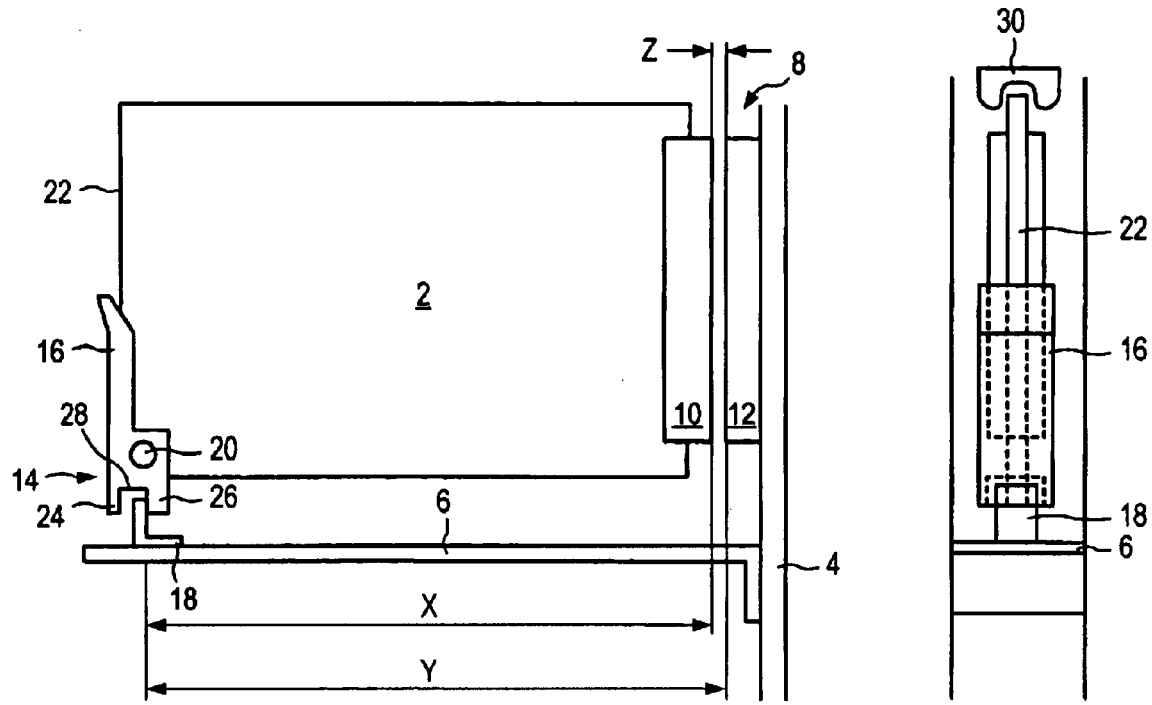
Fig. 1a
(Prior Art)
Fig. 1b
(Prior Art)
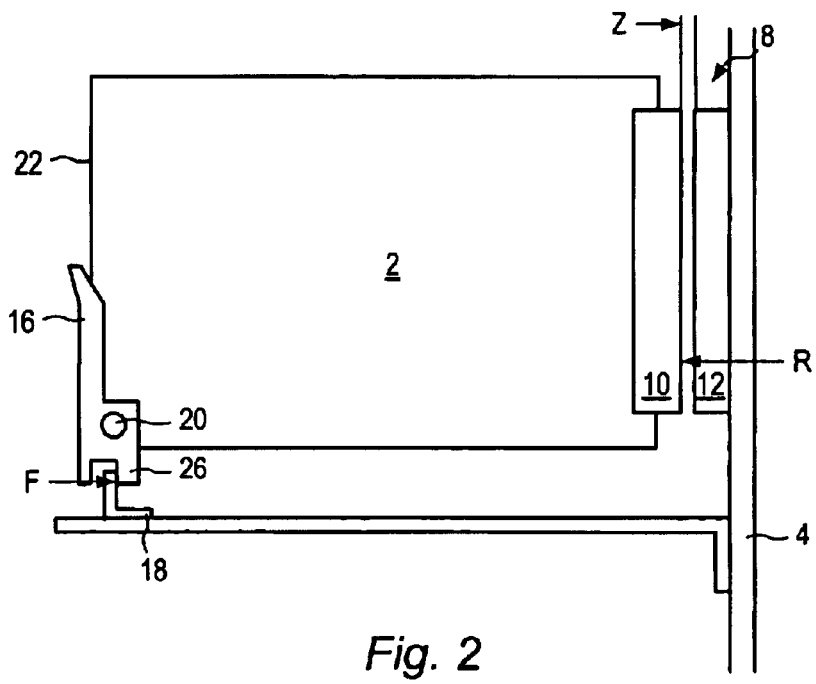
Fig. 2
(Prior Art)

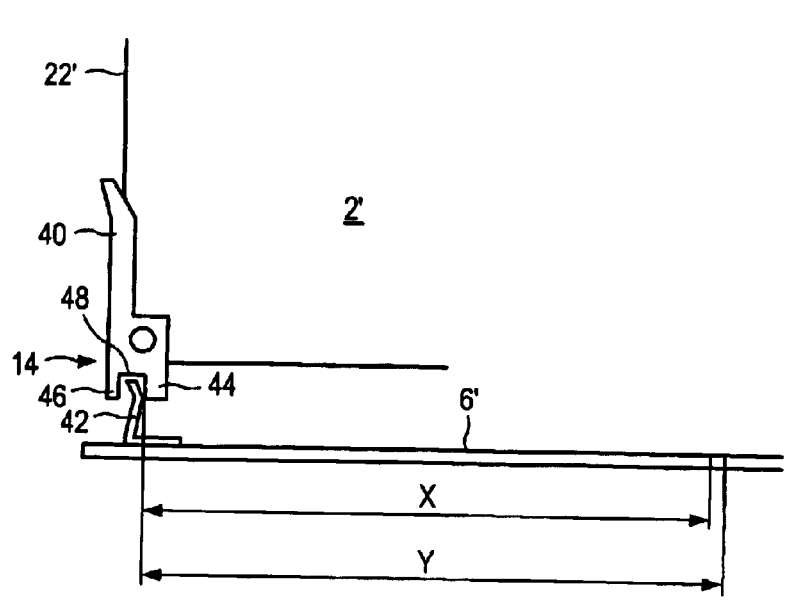
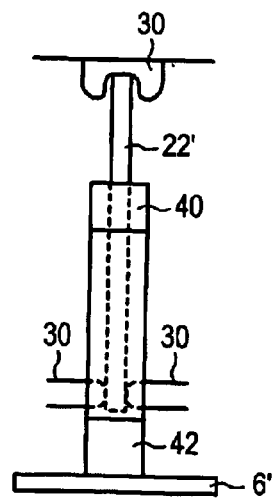
Fig. 3a
Fig. 3b
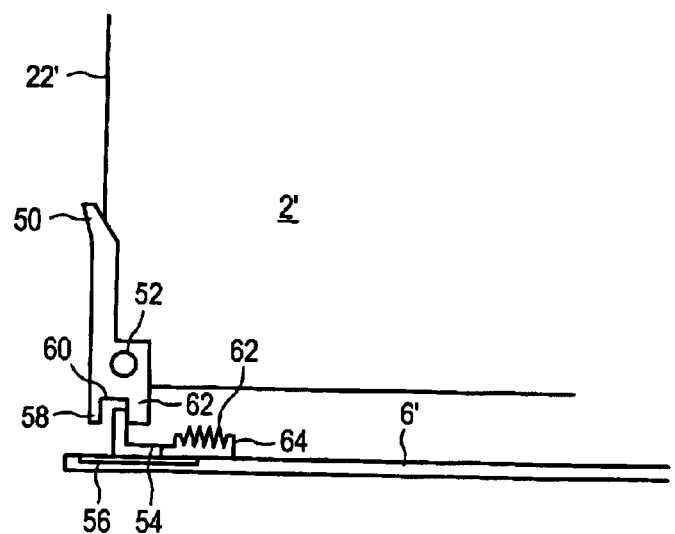
Fig. 4

CIRCUIT BOARD EJECTOR MECHANISM INCLUDING FLEXIBLE COUPLING

BACKGROUND OF THE INVENTION

The present invention relates to ejector mechanisms for providing resiliently biased engagement between a first part of an electrical connector and a mutually engaging second part of the electrical connector mounted respectively on a circuit board and a back plane.

Electronic systems such as computers and telecommunications exchanges are typically constructed in a modular fashion from printed circuit boards (PCB), each circuit board generally performing a specific function. Each PCB requires multiple electrical connections which are generally provided by two part multi-pin electrical connectors which comprise a first part of the connector physically attached to the PCB and a second part attached to a rack, on a system chassis assembly, or a back plane circuit board, which acts as a socket for receiving the first part of the connector. Successful mating of the two parts is required in order to provide reliable electrical connection between the first and the second parts of the connectors.

Ejector mechanisms are user activated devices which are provided to load the PCBs into the system chassis or back plane circuit board to the effect of providing a biasing force which mutually couples the first and second parts of the electrical connectors. Correspondingly, the ejector mechanisms also facilitate ejection of the PCB from the system chassis so that the PCB may be replaced for example.

Known PCB ejector mechanisms typically comprise a lever arm formed on the PCB which is arranged in operation to engage a projection formed on the system chassis. Guide formations also formed on the system chassis or back plane assembly are arranged to receive the PCB and to guide the PCB into a load position in which the first and second parts of the electrical connector engage. The lever arm is pivotally arranged on the PCB so that when the lever arm is arranged in a raised position the connector and socket are disengaged, whereas when the lever arm is lowered by application of force, the PCB is provided with a biasing force which serves to move the PCB in a direction guided by the guiding formations towards the socket thereby mating the first and second parts of the electrical connector. It will be appreciated therefore that there is a range of proximity of the PCB and the socket over which a resistive force is overcome in order to engage the two parts of the electrical connector, when the first and second parts of the connector come into contact. This provides a successful mating of the first and second parts to the effect of providing reliable electrical connection of the pins of the connector.

As will be appreciated however, the first and second parts of the electrical connector generally have a limited mating range. If the connector and socket are forced too closely together the first and/or second parts of the connector can be damaged. Damage can also occur to the components on the PCB or on the system chassis or circuit board back plane. Any damage can cause a failure in the electrical connection provided by the pins of the connector. Conversely, if the two parts are not mated closely enough the two parts of the connector will not fully engage which also thereby causes an unreliable electrical connection.

Accordingly, it will be appreciated that it is desirable to provide an ejector mechanism which provides reliable electrical connection between the two parts of the electrical connector.

SUMMARY OF THE INVENTION

Particular and preferred aspects of the invention are set out in the accompanying independent and dependent claims.

One aspect of the present invention provides an ejector mechanism for a circuit board and back plane operable to provide resiliently biased engagement between a first part of an electrical connector and a mutually engaging second part of the electrical connector. The first and second parts of the electrical connector provide electrical connection for a plurality of electrical channels between the circuit board on which the first part is mounted and the back plane on which the second part is mounted. The ejector mechanism comprises an engaging projection and a lever arm pivotally mounted on one of the circuit board and the back plane and configured to engage the engaging projection forming part of the other of the circuit board and the back plane. The lever arm is operable to apply an engaging force to the circuit board with respect to the back plane, when moved from a first position to a second position, which engaging force causes the first and second parts of the connector to engage. The engagement of the lever arm and the engaging projection is thus provided by a flexible coupling which allows relative movement of the circuit board away from the back plane and a biasing force which biases the circuit board towards the back plane.

During manufacture although the dimensions of the parts of the electrical connector, the circuit board and the back plane are known, variations in tolerances during manufacture can cause the first and second parts of the electrical connector to be either forced too far towards each other thus causing damage to the parts of the connector or indeed the circuit board and back plane itself, or not forced enough, the first and second parts being not pushed far enough together. As such, at the extremes of the range of the tolerance, the two parts of the connector may either not have a close enough fit or may be forced together as a result of being a too close fit thereby reducing in either case the reliability of the electrical connection. Furthermore, it is often a requirement for some electronic systems to withstand a degree of shock. For example, servers and telecommunications exchanges are often required to withstand a shock from, for example, an earthquake. As such the electrical connection formed between the first and second parts must remain competent in spite of a degree of shock.

An embodiment of the ejector mechanism according to the present invention addresses this technical problem by providing a flexible coupling between the lever arm and the engaging projection which allows relative movement of the circuit board away from the back plane and a biasing force which biases the lever arm or engaging projection towards the back plane. The flexible coupling provides an advantage in allowing the circuit board to move away from the back plane to the effect that if the tolerances between the circuit board and back plane are such that the force provided by the lever arm strains the first and second parts of the electrical connector as a result of the circuit board being a too close fit, the relative movement away from the back plane provided by the lever arm serves to relieve this strain. In contrast, if the tolerances combine to the effect that the two parts of the electrical connector are not sufficiently engaged, then the biasing force provided by the flexible coupling can improve the reliability of the electrical connection of the two parts.

The term back plane as used herein refers to and includes any member to which electrical connection of the circuit board is required. As such the back plane may itself be a circuit board, or may be a system chassis containing several such circuit boards.

In one embodiment the flexible coupling is provided by the engaging projection, which is formed from a resiliently deformable material, the material providing the relative movement and the biasing force of the circuit board towards the back plane. Thus by making the engaging projection resiliently deformable the circuit board may move away from the back plane whilst the engaging projection is biased towards the back plane as a result of the resilience of the material.

In an alternative embodiment the flexible coupling is provided by the engaging projection being formed by a rigid member and being slidably mounted on the back plane and a biasing member connected to the back plane and to the engaging projection, the slidably mounted engaging projection providing the relative movement and the biasing member providing the biasing force for biasing the circuit board towards the back plane. The biasing member may be a spring or a resiliently deformable member.

BRIEF DESCRIPTION OF THE DRAWINGS

Embodiments of the present invention will now be described by way of example only with reference to the accompanying drawings, wherein FIGS. 1A and 1B are schematic representations of a circuit board mounted using an ejector mechanism, showing elevation and orthographic projection views respectively, into a back plane showing the relative tolerances of the dimensions which are formed in manufacture, FIG. 2 is a schematic representation of the circuit board and back plane shown in FIG. 1A illustrating the relative forces which effect the parts of the connector, FIGS. 3A and 3B is a schematic representation of an ejector mechanism, showing elevation and orthographic projection views respectively, according to a first example embodiment of the present invention, FIG. 4 is a schematic representation of an ejector mechanism according to a second example embodiment of the present invention.

Figure 5:
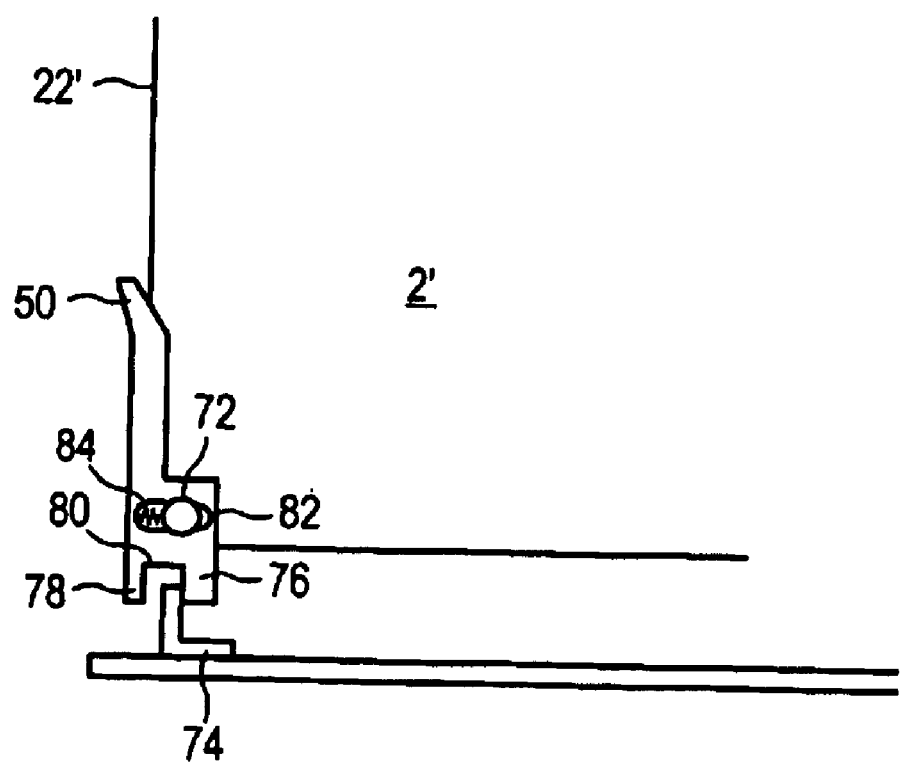
FIG. 5 is a schematic representation of an ejector mechanism according to a third example embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PARTICULAR EMBODIMENTS

FIGS. 1A, 1B and 2 provide a schematic representation of a previously proposed ejector mechanism for providing loading and engagement between first and second parts of an electrical connector mounted respectively on a circuit board and a system chassis or back plane circuit board. For this example it will be assumed that the circuit board is mounted in a system chassis. In FIG. 1A a circuit board 2 is shown mounted in a system chassis. A back plane 4 having a support rail 6 forms part of the system chassis. Electrical connection for a plurality of channels between the circuit board 2 and the system chassis is provided by an electrical connector 8 formed generally from first and second parts 10, 12.

An ejector mechanism 14 according to a previously proposed system is formed from a lever arm 16 and an engaging projection 18. The lever arm 16 is pivotally mounted to the circuit board 2 by a pivotal joint 20. As shown in FIG. 1A the circuit board 2 is in the loaded position so that the lever arm 16 is shown flush against an adjacent edge 22 of the circuit board 2. The ejector arm 16 is arranged to pivot about the pivot point 20 so that in a disengaged position the ejector arm is moved away from the adjacent edge 22 about the pivot point 20 thereby releasing the circuit board 2. To this end the ejector arm has front and rear projections 24, 26 on either side of a recess 28. Thus in the raised position the rear projection 24 engages with the projection 18 of the system chassis thereby forcing the circuit board 2 away from the chassis so that the first and second parts 10, 12 of the electrical connector 8 disengage. Conversely as shown in FIG. 2 when the ejector arm 16 is pushed so that the arm lies flush with the adjacent edge 22, the front projection 26 of the lever arm 16 engages with the engaging projection 18 to provide a force F (FIG. 2) pushing the circuit board 2 about the pivotal mount 20 so that with the assistance of guiding formations 30, the circuit board 2 is forced towards the system chassis so that the first and second parts of the electrical connector 8 mutually engage. However correspondingly as the circuit board is forced towards the system chassis, a resistive force R (FIG. 2) between the first and second parts 10, 12 of the electrical connector 8 resists the forward movement of the circuit board 2.

Returning to FIG. 1A, the relative distances which must be overcome in order for the first and second parts 10, 12 of the electrical connector 8 to provide reliable electrical connection when they mutually engage are represented by the relative dimensions X and Y. The dimension X represents the distance between the face of the front projection 26 of the lever arm 16 and the edge of the first part 10 of the electrical connector 8. The dimension Y represents the relative distance between the front surface of the engaging projection 18 and the plane in which the front edge of the second part 12 of the electrical connector 8 lies. Thus as shown in FIG. 1A the dimension Z represents a relative tolerance between the dimensions X and Y which may vary in accordance with the tolerances of the various parts of the ejector mechanism, circuit board and system chassis. As such, the first and second parts 10, 12 may be either forced too closely together thereby damaging either the system chassis, the circuit board or the first and second parts 10, 12 themselves, or may be insufficient to overcome the resistive force R shown in FIG. 2, which is required in order to effect reliable electrical connection.

A first embodiment of the present invention is shown in FIGS. 3A and 3B. In FIG. 3A the ejector mechanism is shown to comprise a lever arm 40 pivotally mounted on a circuit board $2^1$ and an L-shaped engaging projection 42 mounted on the system chassis $6^1$. The engaging projection 42 according to the first embodiment of the present invention is arranged to be resiliently deformable and so is manufactured from a resiliently deformable material. As before the lever arm 40 has front and rear projections 44, 46 and a recess 48 in which the engaging projection 42 is received. As the ejector arm 40 is lowered to lie flush with the adjacent edge of $22^1$ of the circuit board $2^1$, the front projection 44 engages with the face of the deformable engaging projection 42 and as before a force is provided to the circuit board to the effect that the first and second parts of the electrical connector (not shown) are forced to mutually engage. However the deformable engaging projection 42 is arranged to provide a relative amount of movement on the circuit board $2^1$ away from the system chassis $6^1$ with the effect that if the tolerances during manufacture are such that the circuit board $2^1$ is otherwise too close to the system chassis $6^1$ thereby causing the first and second parts of the connector to be strained when mutually engaged by the biasing force F, the relative movement of the circuit board $2^1$ away from the system chassis $6^1$ provided by the deformable projection 42 serves to relieve this strain. The resilient deformability of the projection 42 however serves to bias the circuit board $2^1$ towards the chassis $6^1$. Thus the resiliently deformable engaging projection $42^1$ provides a flexible coupling between the lever arm 40 and the engaging projection 42.

A second embodiment of the present invention is shown in FIG. 4. In FIG. 4, an ejector mechanism is shown to comprise a lever arm 50 pivotally mounted to a circuit board $2^1$ by a pivotal joint 52 and a rigid engaging projection 54 which is slidably mounted to the system chassis $6^1$ within a sliding track 56. As before the lever arm 50 has a front projection 56 and a rear projection 58 and a recess 60 between the front and rear projections within which the engaging projection 54 is received. The engaging projection 54 is connected to a spring 62 which is secured by a coupling 64 to the system chassis $6^1$.

In the second embodiment, the relative movement of the circuit board $2^1$ away from the system chassis $6^1$ is provided by the slidable coupling of the engaging projection to the system chassis $6^1$. The biasing force of the circuit board $2^1$ to the system chassis is provided by the spring 62 which is secured to the slidably mounted engaging projection 54 at one end and to the other end to the system chassis on the coupling 64. As before, as the lever arm 50 is lowered so that the arm is flush with the edge $22^1$, thereby providing the force for engaging the first and second parts of the electrical connector, the engaging projection 54 is arranged to be slidably mounted in the slidable mounting 56 to the effect that the circuit board can move away from the chassis thereby relieving any strain which may occur as a result of the manufacturing tolerances combining to reduce the relative distances between the first and second parts of the connector. The biasing spring 62 however forces the circuit board towards the chassis in opposition to the slidable movement away from the chassis. Again the slideably mounted engaging projection, in combination with the biasing spring provide a flexible coupling between the engaging projection and the lever arm.

The third embodiment of the present invention is shown in FIG. 5. In FIG. 5 an ejector mechanism is shown to comprise a lever arm 70 pivotally mounted on the circuit board $2^1$ by a pivotal mounting 72 and a rigid engaging projection 74. The lever arm has forward and rear projections 76, 78 formed between a recess 80. As before, the front projection of the lever arm engages with the rigid engaging projection 74 as the lever arm 70 is lowered to lie flush with the adjacent edge $22^1$. However, the pivotal mounting 72 is arranged to move freely within an mounting hole 82 which provides a slidable movement of the pivotal mounting 72 in the mounting hole 82. The mounting includes a pivot pin 72 which is attached to one end of a compression spring 84 which is mounted within the mounting hole 82 so that a biasing force is applied to the pivot pin towards the back plane 4. For this embodiment, the flexible coupling of the lever arm 70 and the engaging projection 74 are provided by the slidably mounted pivot pin 72 within the receiving hole 82 and the biasing of the circuit board $2^1$ towards the system chassis is provided by the compression spring 84. Therefore, the relative movement of the circuit board away from the chassis in the case where the tolerances combine to cause the engagement of the two parts of the connector to be under strain is relieved by the relative movement provided by the pivoting pin within the recess 82. Correspondingly, the spring 84 biases the circuit board towards the chassis by providing a biasing force of the pin 72.

Various modifications and alternatives to the embodiments of the present invention herein before described can be envisaged which fall within the spirit and scope of the present invention as defined in the appended claims. As it will be appreciated for example the relative position of the lever arm could be raised in order to engage the circuit board and lowered to disengage the circuit board. Correspondingly, the lever arm could be mounted on the chassis and the engaging projection could be mounted on the circuit board. Although the embodiments of the invention have been described with reference to a system chassis, it will be appreciated that this is one example of a back plane to which the circuit board is to be connected.

Numerous variations and modifications will become apparent to those skilled in the art once the above disclosure is fully appreciated. It is intended that the following claims be interpreted to embrace all such variations and modifications.

What is claimed is:

1. A circuit board ejector mechanism operable to provide resiliently biased engagement between a first part of an electrical connector mounted on a circuit board and a mutually engaging second part of said electrical connector mounted on a back plane, said first and second parts of said electrical connector providing electrical connection between said circuit board and said back plane, said ejector mechanism comprising:

an engaging projection mountable on a chassis with respect to which said back plane is mounted; and a lever arm pivotally mountable about an axis that passes through said circuit board and configured to engage said engaging projection, said lever arm being operable to apply an engaging force to said engaging projection to urge said circuit board towards said back plane when moved from a first position to a second position, which engaging force causes said first and second parts of the connector to engage, wherein said engagement of said lever arm and said engaging projection is provided by a flexible coupling which allows relative movement of said circuit board with respect to said back plane, and wherein the flexible coupling provides a biasing force which biases said circuit board towards said back plane.

2. An ejector mechanism as claimed in claim 1, wherein said flexible coupling is provided by said engaging projection being formed from a resiliently deformable material, said material providing said relative movement and said biasing force of said circuit board towards said back plane.

3. An ejector mechanism as claimed in claim 1, wherein said flexible coupling is provided by said engaging projection being formed by a rigid member slidably mounted on said chassis and a biasing member connected between said chassis and said engaging projection, said slidable mounting providing said relative movement and said biasing member providing said biasing force for biasing said circuit board towards said back plane.

4. An ejector mechanism as claimed in claim 3, wherein said biasing member is a spring or a resiliently deformable member.

5. An ejector mechanism as claimed in claim 3, wherein said flexible coupling is provided by a mounting of said pivotably mounted lever arm on said circuit board that provides translatory as well as pivotal movement to provide said relative movement between said lever arm and said engaging projection, and a biasing member coupled to said pivotal mounting providing said biasing force for biasing said circuit board towards said back plane.

6. An assembly including a circuit board, a chassis and a back plane, a first part of an electrical connector being mounted on said circuit board and a mutually engaging second part of said electrical connector being mounted on said backplane, said first and second parts of said electrical connector providing electrical connection between said circuit board and said back plane, said back plane being mounted with respect to said chassis, and an ejector mechanism having:

an engaging projection mounted on said chassis; and a lever arm pivotally mounted about an axis that passes through said circuit board and configured to engage said engaging projection, said lever arm being operable to apply an engaging force to said engaging projection to urge said circuit board towards said back plane when moved from a first position to a second position, which engaging force causes said first and second parts of the connector to engage, wherein said engagement of said lever arm and said engaging projection is provided by a flexible coupling which allows relative movement of said circuit board with respect to said back plane and wherein said flexible coupling provides a biasing force which biases said circuit board towards said back plane.

7. A circuit board comprising:

a first part of an electrical connector arranged to mutually engage a second part of said electrical connector, which second part of said electrical connector is mounted on a back plane, said first and second parts of said electrical connector providing electrical connection between said circuit board and said back plane, a lever arm pivotally mounted about an axis that passes through said circuit board and configured to engage an engaging projection mounted on a chassis with respect to which said back plane is mounted, said lever arm being operable to apply an engaging force to said circuit board by engagement with said engaging projection when moved from a first position to a second position, which engaging force causes said first part of said electrical connector to engage with said second part of the connector, wherein said mounting of said pivotably mounted lever arm on said circuit board provides translatory as well as pivotal movement to provide relative movement between said lever arm and said engaging projection, and a biasing member coupled to said pivotal mounting providing a biasing force for biasing said circuit board towards said back plane.

8. A chassis supporting a back plane arranged to receive at least one circuit board, said back plane comprising at least one second part of an electrical connector, mounted on said back plane and engageable with a first part of said electrical connector mounted on said circuit board, wherein an engaging projection, engageable with a lever arm formed on said circuit board, is mounted on said chassis, said engaging projection providing a flexible coupling which allows relative movement of said circuit board with respect to said chassis, and thereby with respect to said back plane and a biasing force which biases said circuit board towards said back plane.

9. A chassis as claimed in claim 8, wherein said engaging projection is formed from a resiliently deformable material, said material providing said relative movement and said biasing force of said circuit board towards said back plane.

10. A chassis as claimed in claim 8, wherein said engaging projection is formed by a rigid member slidably mounted on said chassis and a biasing member connected between said chassis and said engaging projection, said slidable mounting providing said relative movement and said biasing member providing said biasing force for biasing said circuit board towards said back plane.

11. A chassis as claimed in claim 10, wherein said biasing member is a spring or a resiliently deformable member.

* * * * *